United States Patent [19]

Maeda et al.

[11] Patent Number: 5,680,091
[45] Date of Patent: Oct. 21, 1997

[54] MAGNETORESISTIVE DEVICE AND METHOD OF PREPARING THE SAME

[75] Inventors: Atsushi Maeda, Neyagawa; Toshio Tanuma, Toyonaka; Minoru Kume, Shijonawate; Kazuhiko Kuroki, Uji, all of Japan

[73] Assignee: Sanyo Electric Co., Ltd., Moriguchi, Japan

[21] Appl. No.: 524,746

[22] Filed: Sep. 7, 1995

[30] Foreign Application Priority Data

Sep. 9, 1994 [JP] Japan ..................... 6-216352
Jun. 26, 1995 [JP] Japan ..................... 7-159563

[51] Int. Cl.⁶ ............................................. H01L 43/00
[52] U.S. Cl. ..................... 338/32 R; 360/113; 360/126
[58] Field of Search ................. 338/32 R; 324/207.21, 324/252; 360/113, 126; 427/128, 129

[56] References Cited

U.S. PATENT DOCUMENTS

| | | |
|---|---|---|
| 2,979,668 | 4/1961 | Dunlap, Jr. . |
| 3,019,125 | 1/1962 | Eggengerger et al. ............ 360/113 |
| 3,567,525 | 3/1971 | Graham et al. . |
| 3,975,772 | 8/1976 | Lin . |
| 4,187,553 | 2/1980 | Ahn et al. . |
| 4,516,180 | 5/1985 | Narishige et al. . |
| 4,623,867 | 11/1986 | Lundquist et al. . |
| 4,935,311 | 6/1990 | Nakatani et al. . |
| 4,949,039 | 8/1990 | Grünberg . |
| 4,987,094 | 1/1991 | Colas et al. ..................... 431/81 |
| 5,117,321 | 5/1992 | Nakanishi et al. . |
| 5,134,533 | 7/1992 | Friedrich et al. ............... 360/113 |
| 5,159,513 | 10/1992 | Dieny et al. . |
| 5,164,025 | 11/1992 | Hasegawa . |
| 5,187,628 | 2/1993 | Kanai et al. ..................... 360/126 |
| 5,196,821 | 3/1993 | Partin et al. . |
| 5,206,590 | 4/1993 | Dieny et al. . |
| 5,243,316 | 9/1993 | Sakakima et al. . |
| 5,268,043 | 12/1993 | McCowen . |
| 5,277,991 | 1/1994 | Satomi et al. . |
| 5,296,987 | 3/1994 | Anthony et al. ................ 360/113 |
| 5,304,975 | 4/1994 | Saito et al. . |
| 5,313,186 | 5/1994 | Schuhl et al. . |
| 5,324,593 | 6/1994 | Lal et al. . |
| 5,366,815 | 11/1994 | Araki et al. . |
| 5,422,621 | 6/1995 | Gambino et al. . |
| 5,425,819 | 6/1995 | Oohashi et al. . |
| 5,432,734 | 7/1995 | Kawano et al. . |
| 5,442,508 | 8/1995 | Smith . |
| 5,462,809 | 10/1995 | Berkowitz . |
| 5,474,833 | 12/1995 | Etienne et al. . |
| 5,510,172 | 4/1996 | Araki et al. . |
| 5,527,626 | 6/1996 | Gijs et al. ..................... 360/113 |
| 5,530,608 | 6/1996 | Aboaf et al. ..................... 360/113 |

FOREIGN PATENT DOCUMENTS

| | | | |
|---|---|---|---|
| 3229774 | 3/1983 | Germany .................. 338/32 R |
| 58-36406 | 8/1983 | Japan . |
| 59-11522 | 1/1984 | Japan . |
| 59-63019 | 4/1984 | Japan . |
| 59-87617 | 5/1984 | Japan . |

(List continued on next page.)

OTHER PUBLICATIONS

A. E. Berkowitz et al. "Giant Magnetoresistance in Heterogeneous Cu-Co Alloys" Physical Review Letters, vol. 68, No. 25, Jun. 1992, pp. 3745–3748.

(List continued on next page.)

*Primary Examiner*—Teresa J. Walberg
*Assistant Examiner*—Karl Easthom
*Attorney, Agent, or Firm*—W. G. Fasse; W. F. Fasse

[57] ABSTRACT

A magnetoresistive device includes a substrate and a magnetic film which is formed by alternately stacking magnetic and non-magnetic layers with each other on the substrate. The substrate is prepared to have a texture on its surface, and the magnetic film is formed on this substrate so that a texture is formed along the interface between the magnetic and non-magnetic layers. The texture can be an atomic level texture with step features dimensioned dependent upon the lattice constant, or may be an etched texture of features having desired dimensions in a specified range.

15 Claims, 9 Drawing Sheets

FOREIGN PATENT DOCUMENTS

| | | |
|---|---|---|
| 60-89809 | 5/1985 | Japan . |
| 62-97118 | 5/1987 | Japan . |
| 403257977 | 11/1991 | Japan ................................ 338/32 R |
| 4-218982 | 8/1992 | Japan . |
| 4-358310 | 12/1992 | Japan . |
| 4-360009 | 12/1992 | Japan . |
| 405114761 | 5/1993 | Japan ................................ 338/32 R |
| 6-69563 | 3/1994 | Japan ................................ 338/32 R |
| 6-101000 | 4/1994 | Japan . |
| 6-169117 | 6/1994 | Japan . |
| 6-318515 | 11/1994 | Japan . |

OTHER PUBLICATIONS

A. Chaiken et al. "Low–field spin–valve magnetoresistance in Fe–Cu–Co sandwiches" Appl. Phys. Lett. 59 Jul. 1991, pp. 240–242.

B. Dieny et al. "Giant magnetoresistance of magnetically soft sandwiches: Dependence on temperature and on layer thicknesses" Physical Review B, Jan. 1992, pp. 806–813.

D. H. Mosca et al. "Oscillatory interlayer coupling and giant magnetoresistance in Co/Cu multilayers" Journal of Magnetism and Magnetic Materials 94 (1991), pp. L.1–L.5.

Dieny et al. "Giant Magnetoresistance in Soft Ferromagnetic Multi–Layers" Physical Review Condensed Matter, 43 (1991) Jan. vol. 1, Part B, pp. 1297–1300.

J. Smyth et al. "Hysteresis in Lithographic Arrays . . . ", J. Appl. Phys. Apr. 1994, vol. 69, No. 8, pp. 5262–5266.

Shinjo et al. "Metallic Superlattices—Artificially Structured Materials",; Studies in physical and theoretical Chemistry 49; 1987, pp. 2–5.

Maeda et al.; "Magnetoresistance characteristics of grain––type alloy thin films of various compositions", J. Phys.: Condens. Matter 5 (1993) 6745–6752.

S. H. Liou et al. "The process–controlled magnetic properties of nanostructured Co/Ag composite films" J. Appl. Phys. 70 Nov. 91 (Magnetism of Fine Particles) pp. 5882–5884.

P. Grünberg et al., Interlayer Exchange, Magnetotransport and Magnetic Domains in Fe/CR Layered Structures, Journal of Magnetism and Magnetic Materials, 1992, pp. 1734 – 1738.

S. Demokritov et al., Evidence for Oscillations in the Interlayer Coupling of Fe Films Across Cr Films From Spin Waves and M(H) Curves, Europhysics Letters, Aug. 1991, pp. 881–886.

Hideo Fujiwara et al., Analytical Model of Giant MR in Multilayers with Biquadratic Coupling, Journal of Magnetism and Magnetic Materials, 1994, pp. L 23–L29.

Martin Parker et al., Bioquadratic Effects in Magnetic Multilayers with Low–Field Giant MR, Journal of the Magnetics Society of Japan, vol. 18, 1994, pp. 371–377.

K. Inomata et al. Giant Magnetoresistance Effect and Magnetic Anisotropy in $CO_9Fe/Cu/CO_9Fe$ Trilayers on MgO(110) Substrates, Journal of Magnetism and Magnetic Materials 137 (1994) 257–263.

DT3229774 Eng. transtaion.

6–69563 Eng. translation.

(a)

(b)

(c)

(d)

MAGNETORESISTIVE DEVICE AND METHOD OF PREPARING THE SAME

CROSS REFERENCE TO RELATED APPLICATIONS

This application is related to copending U.S. application Ser. No. 08/406,671 filed Mar. 20, 1995 entitled Magnetoresistive Element and to copending application U.S. Ser. No. 08/511,012 filed Aug. 3, 1995 entitled Magnetoresistive Film.

BACKGROUND OF THE INVENTION

1. Field of the Invention

The present invention relates to a magnetoresistive device (MR device) such as a magnetoresistive magnetic head (MR head) or a magnetoresistive sensor (MR sensor) for reading information signals from a magnetic medium, and more particularly, it relates to a magnetoresistive device comprising a magnetic film which is formed by stacking magnetic and non-magnetic layers with each other.

2. Description of the Background Art

A magnetoresistive device, which is adapted to detect a change in electric resistance of a magnetic substance caused by application of a magnetic field, thereby measuring a magnetic field strength and its change, must generally have a high magnetoresistance ratio (MR ratio) and excellent magnetic field sensitivity, i.e., a small operating magnetic field.

In recent years, a magnetoresistive device comprising a magnetic film which is formed by stacking magnetic and non-magnetic layers with each other has become known as an element exhibiting gigantic magnetoresistance change, i.e., a high MR ratio.

A magnetoresistive device which is prepared by alternately stacking Co and Cu layers with each other for forming antiferromagnetic coupling across the Co layers is known as one of such magnetoresistive devices exhibiting gigantic magnetoresistance change. In this magnetoresistive device, the Co layers which are magnetic layers having the same composition and the same coercive force are present alternatingly in opposite sides of the Cu layer which is a non-magnetic layer. Such a magnetoresistive device is generally called an artificial lattice type element.

On the other hand, another magnetoresistive device having a sandwich structure which is formed by providing magnetic layers of different coercive force on both sides of a Cu layer serving as a non-magnetic layer is also known as an element exhibiting gigantic magnetoresistance change. In such a magnetic film, no magnetic coupling is present across the magnetic layers having the non-magnetic layer arranged therebetween. Such a magnetoresistive device is generally called a spin valve type element.

These conventional magnetoresistive devices exhibiting a gigantic magnetoresistance change exhibit considerably high MR ratios and excellent magnetic field sensitivity. However, the values thereof are still insufficient, and the development of a magnetoresistive device which has a higher MR ratio and higher magnetic field sensitivity is awaited.

SUMMARY OF THE INVENTION

An object of the present invention is to provide a novel structure of a magnetoresistive device having a high MR ratio and high magnetic field sensitivity, in order to satisfy the aforementioned requirement.

The present invention is directed to a magnetoresistive device, or a magnetoresistive element comprising a magnetic film which is formed by stacking magnetic and non-magnetic layers with each other, and is characterized in that a substantially regular texture is formed at the interface between the magnetic and non-magnetic layers.

In the present invention, a substantially regular texture means that a prescribed unit of projection and recess is formed repeatedly.

According to the present invention, the non-magnetic layer has electrical conductivity, and is made of a metal or an alloy.

According to a first aspect of the present invention, a substantially regular atomic level texture is formed at the interface between the magnetic and non-magnetic layers.

The substantially regular atomic level texture is provided in the form of steps or angular ridges, for example, of about 3 to 30 Å in width, for example, with the height for a single atom being about 3 Å, for example. This texture can be provided in the form of substantially regular steps by using a crystal lattice.

In one of plural modes according to the first aspect of the present invention, a substrate is prepared to have an atomic level texture on its surface, whereupon magnetic and non-magnetic layers are stacked on this substrate to form a magnetic film, thereby forming a substantially regular atomic level texture at the interface between the magnetic and non-magnetic layers.

The aforementioned substrate having a substantially regular atomic level texture on its surface can be prepared from a single-crystalline off substrate which is cut along plane which is inclined from a low index lattice plane such as the (100) plane, i.e., the so-called just plane, at a prescribed angle. For example, the substrate can be prepared from an off substrate having a surface which is inclined from the (100) plane of a GaAs substrate at about 2° to 15°. A similar silicon substrate etc. can also be employed.

According to a second aspect of the present invention, a substrate having a texture on its surface is so employed that the magnetic film is formed on this substrate, thereby forming a texture at the interface between the magnetic and non-magnetic layers. Preferably, the texture is formed by anisotropic etching.

According to the second aspect of the present invention, the texture provided on the substrate surface preferably has an inclined plane. Namely, the magnetoresistive device comprises a substrate which is provided with a texture having an inclined plane on its surface, and a magnetic film, formed by stacking magnetic and non-magnetic layers with each other, which is provided on the surface of the substrate having the texture. Thus, a texture is formed at the interface between the magnetic and non-magnetic layers by the surface shape of the substrate.

According to the second aspect, it is possible to form the texture on the substrate surface by employing a single-crystalline substrate as the substrate and etching the same by using its crystal lattice. Such a single-crystalline substrate can be prepared from a silicon substrate or a GaAs substrate.

The present invention is also directed to a method which can prepare the magnetoresistive device according to the second aspect of the present invention. The method according to the present invention comprises the steps of forming a mask layer having a prescribed pattern on a substrate, etching a surface region of the substrate which is not provided with the mask layer, thereby forming a texture on the substrate surface, and forming a magnetic film by stacking magnetic and non-magnetic layers with each other, on the substrate provided with the texture.

When the substrate is prepared from a single-crystalline substrate, it is possible to form a texture having an inclined plane along the crystal lattice plane of the substrate by etching the substrate surface.

In one of the preferred modes, the step of forming the mask layer comprises the steps of preparing a silicon substrate as the substrate, forming an oxide film by oxidizing the surface of the silicon substrate, forming a resist film on the oxide film, patterning the resist film by photolithography, and patterning a region of the oxide film not provided with the resist film, thereby forming the mask layer. Therefore, the texture on the substrate surface can be forme in a regular pattern by forming the mask layer in a regular pattern.

The etching method is not particularly restricted but wet etching, dry etching or reactive ion etching (RIE) can be employed. When the substrate is prepared from a single-crystalline substrate such as a silicon substrate, a texture having an inclined plane along the crystal lattice plane can be formed by wet etching.

The magnetic film formed in the present invention is not particularly restricted so far as the same is formed by stacking magnetic and non-magnetic layers with each other. For example, it is possible to employ a magnetic film exhibiting giant magnetoresistance effect, which has a structure formed by stacking first and second magnetic layers with each other with a non-magnetic layer therebetween, as described above with reference to the prior art.

In a magnetic film called an artificial lattice type film, first and second magnetic layers are made of magnetic materials having substantially the same composition and substantially the same coercive force. In a magnetic film called a spin valve type film, on the other hand, first and second magnetic layers are made of magnetic materials which are different from each other in coercive force.

When the texture is formed in a specific direction at the interface in the magnetoresistive device according to the present invention, the same exhibits an anisotropic magnetic property. Namely, it is possible to attain the highest MR ratio by feeding a measuring current in a direction across the texture which is formed at the interface.

The reason why the magnetoresistive device according to the present invention exhibits a high MR ratio and high magnetic field sensitivity has not yet been clarified in detail, while it is conceivable that conduction atoms contained in the non-magnetic layer are strongly influenced by the magnetic layers due to formation of the texture along each interface between the magnetic and non-magnetic layers, which has the effect of increasing magnetic scattering.

According to the inventive method, the mask layer is formed on the substrate so that the substrate surface is etched through the mask layer serving as a mask, thereby forming the texture on the substrate surface. Thus, it is possible to form the texture on the substrate surface in a pattern of a desired plane shape by patterning the mask layer into a prescribed shape.

When the substrate is prepared from a single-crystalline substrate, it is possible to form a texture having an inclined plane along the crystal lattice plane of the substrate.

According to the present invention, it is possible to attain a higher MR ratio as compared with the conventional magnetoresistive device employing a magnetic film having no texture along each interface between magnetic and non-magnetic layers, thereby improving magnetic field sensitivity.

Thus, the magnetoresistive device according to the present invention can be effectively applied to a reproducing magnetic head or a magnetic sensor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Examples according to the first aspect of the present invention are now described.

Figure 1:
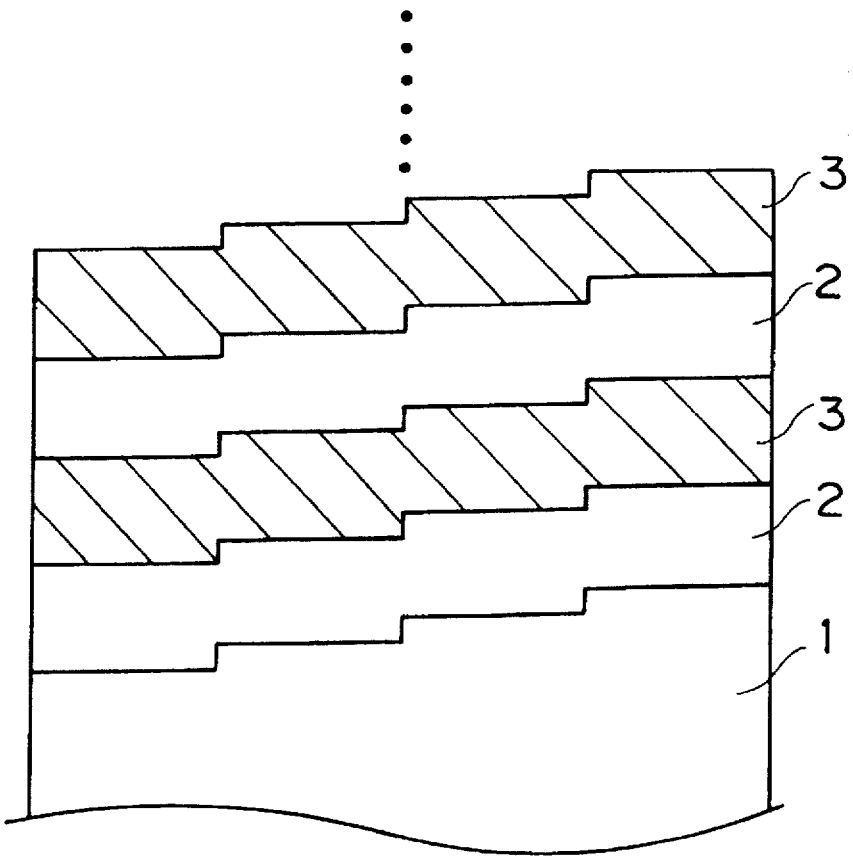
FIG. 1 is a typical sectional view showing a multilayer magnetic film according to an Example of the first aspect of the present invention.

As shown in FIG. 1, a Cu layer 2 was formed on a substrate 1 as a non-magnetic layer, and a Co layer 3 was formed on the Cu layer 2 as a magnetic layer. Both of the Cu and Co layers 2 and 3 were formed by vapor deposition, to have thicknesses of about 20 Å and about 15 Å respectively. Such stacking of the Cu and Co layers 2 and 3 was repeated 15 times, to form 15 units of the Cu and Co layers 2 and 3.

The substrate 1 was formed by an off substrate which was prepared by cutting a GaAs substrate along a plane inclined by 2° from its (100) plane and polishing the same. Thus, the lowermost Cu layer 2 was formed on the surface of the substrate 1 which was inclined by 2° from its (100) plane. As typically shown in FIG. 1, therefore, the substrate 1 was provided on its major surface with a substantially regular atomic level texture, which was in the form of steps or stepped angular ridges having respective first and second ridge faces forming a triangular cross-sectional ridge shape, on the basis of its lattice constant, so that the Cu and Co layers 2 and 3 were stacked on the surface provided with such a texture. Thus, the Cu and Co layers 2 and 3 were formed along the texture shape as shown in FIG. 1, so that textures were formed at the interfaces between the Cu and Co layers 2 and 3 on the basis of the texture formed on the surface of the substrate 1. Thus, a texture pattern of the interface texture corresponds to and aligns with the texture pattern of the substrate texture. As also shown in FIG. 1, the multilayer magnetic film and each of its layers 2 and 3 are respectively continuous layers extending across the substrate surface, uninterrupted by the substrate texture or the interface texture, and continuously extending over and along the first and second ridge faces of the ridges.

In the multilayer magnetic film according to this Example, antiferromagnetic coupling was present across the Co layers 3 embracing or having the Cu layer 2 therebetween, thereby defining the so-called artificial lattice type multilayer magnetic film.

The multilayer magnetic film obtained in the aforementioned manner was subjected to measurement of the MR ratio and the operating magnetic field (Hs). On the other hand, a comparative example was prepared by stacking 15 units of Cu and Co layers on the (100) plane of a GaAs substrate similarly to the above for forming a multilayer magnetic film, which in turn was subjected to measurement of the MR ratio and the operating magnetic field. These properties were measured along a direction across the texture of the substrate. Table 1 shows the results.

TABLE 1

| Inventive Sample | | Comparative Sample | |
| --- | --- | --- | --- |
| MR Ratio (%) | Hs (Oe) | MR Ratio | Hs (Oe) |
| 65 | Unsaturated | 28 | Unsaturated |

As understood from Table 1, the MR ratio of the inventive multilayer magnetic film was remarkably higher than that of the comparative one. While it was impossible to quantitatively evaluate the operating magnetic field due to unsaturation, the magnetic field sensitivity was indirectly improved in the inventive multilayer magnetic film due to the increase of the MR ratio.

Figure 2:
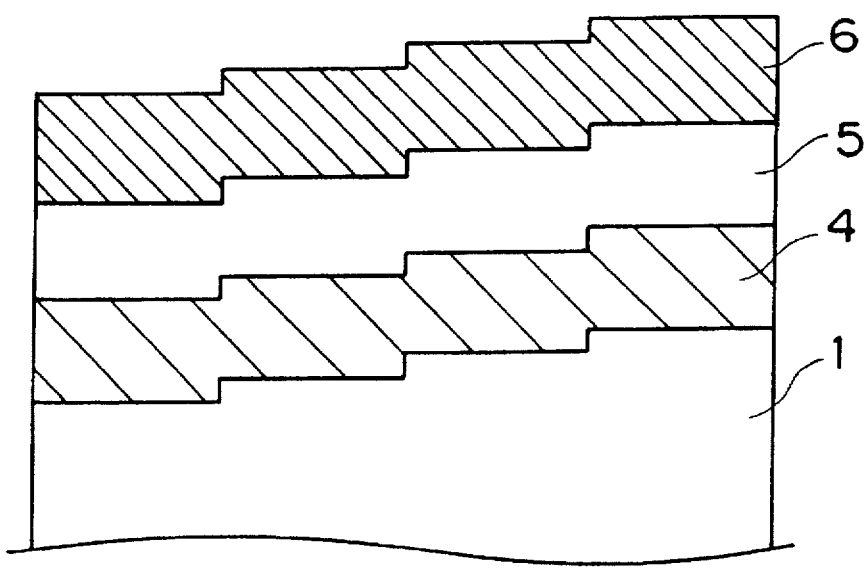
FIG. 2 is a typical sectional view showing a multilayer magnetic film according to another Example of the first aspect of the present invention.

Then, a Co layer 4, a Cu layer 5 and an Fe layer 6 having thicknesses of 40 Å, 40 Å and 60 Å respectively were successively formed on a GaAs substrate 1, which was identical to that employed in the aforementioned Example, by ion beam sputtering, as shown in FIG. 2. In this multi-layer magnetic film, the Co and Fe layers 4 and 6, which were first and second magnetic layers having different coercive force, were provided on both sides of the Cu layer 5 which was a non-magnetic layer, to form a sandwich structure. Thus, this multilayer magnetic film formed the so-called spin valve type magnetic film.

Also in this Example, the Co, Cu and Fe layers 4, 5 and 6 were formed along the texture on the surface of the substrate 1, so that atomic level textures were formed at the interfaces between the Co and Cu layers 4 and 5 and between the Cu and Fe layers 5 and 6 respectively.

Figure 3:
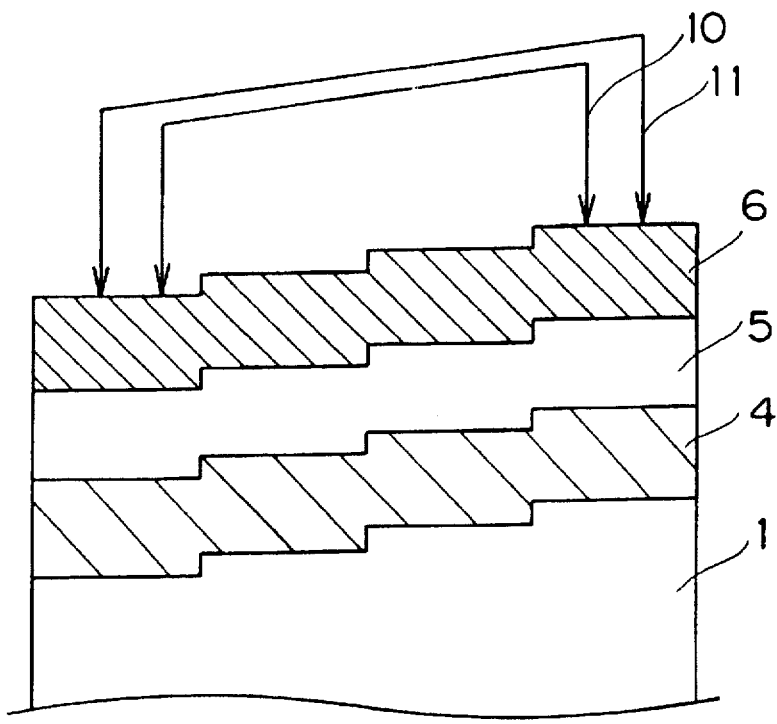
FIG. 3 is a typical sectional view showing a current terminal and a voltage terminal arranged in a direction across textures along interfaces of the multilayer magnetic film shown in FIG. 2.

A current terminal 10 and a voltage terminal 11 were arranged on the multilayer magnetic film according to this Example as shown in FIG. 3, to measure magnetic dependence of the MR ratio. As shown in FIG. 3, the current and voltage terminals 10 and 11 were arranged in a direction across the textures at the interfaces between the Co and Cu layers 4 and 5 and between the Cu and Fe layers 5 and 6. Therefore, a measuring current was fed between the current terminals 10 in the direction across these textures at the interfaces and substantially along and parallel to the interfaces.

Figure 4:
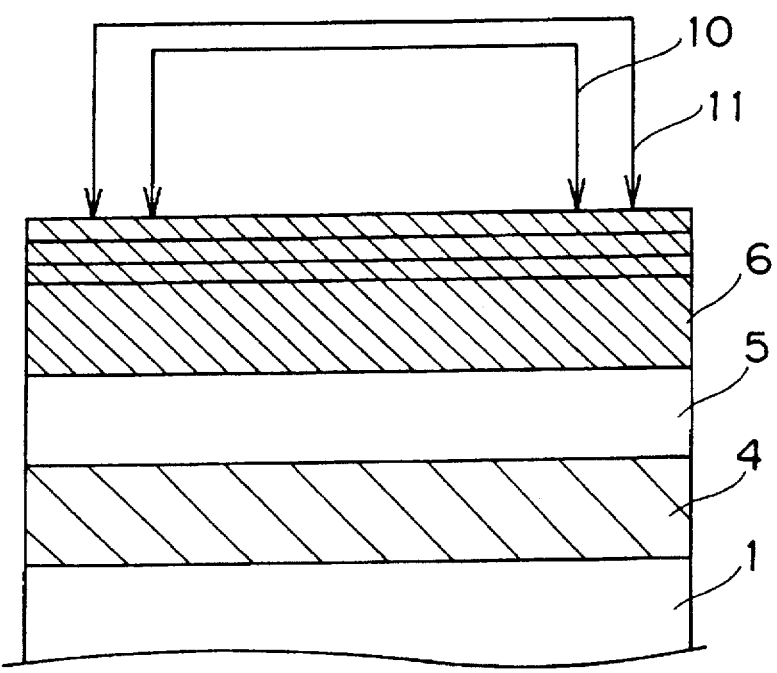
FIG. 4 is a typical sectional view showing a current terminal and a voltage terminal arranged perpendicularly to the direction across the textures at the interfaces of the multilayer magnetic film shown in FIG. 2.

As shown in FIG. 4, a comparative example was prepared by arranging a current terminal 10 and a voltage terminal 11 in a direction perpendicular to that shown in FIG. 3. Thus, a measuring current was fed in the direction parallel to the textures at the interfaces between the Co and Cu layers 4 and 5 and between the Cu and Fe layers 5 and 6.

Figure 5:
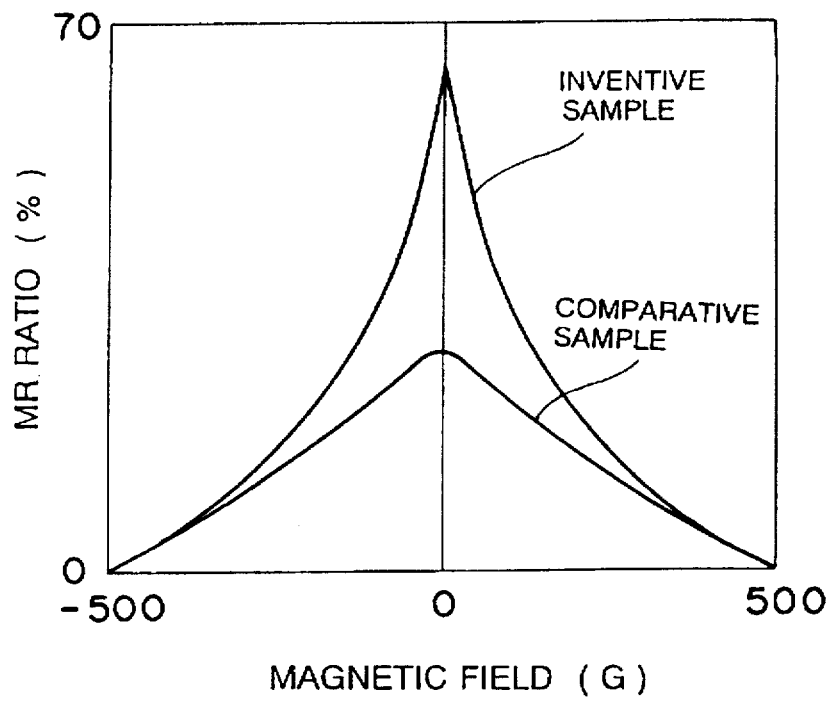
FIG. 5 illustrates the magnetic field dependence of MR ratios measured in the terminal arrangement state shown in FIG. 3.

FIG. 5 shows the results of magnetic field dependence of the MR ratios measured in the states shown in FIGS. 3 and 4 respectively. The curves "inventive sample" and "comparative sample" shown in FIG. 5 were measured in the terminal arrangement states shown in FIGS. 3 and 4 respectively.

As clearly understood from FIG. 5, a high MR ratio was attained by arranging the current and voltage terminals in the direction across the textures at the interfaces. It is also understood that the MR ratios of the same type of multilayer magnetic films were extremely varied dependent upon the directions of arrangement of the terminals and application of the magnetic fields. Namely, the inventive multilayer magnetic film had anisotropy in its magnetoresistive properties. It is further understood that conduction electrons contained in the non-magnetic layer were influenced by the textures at the interfaces, to cause magnetic scattering by the magnetic layers.

A multilayer film which was similar to that shown in FIG. 2 was formed on the (100) plane of a GaAs substrate. This film exhibited magnetic field dependence of the MR ratio which was similar to that of comparative sample shown in FIG. 5.

While the Example shown in FIG. 2 was provided with a single unit consisting of the Co, Cu and Fe layers 4, 5 and 6, the present invention is also applicable to a multilayer magnetic film which is formed by stacking a plurality of such units with each other.

Figure 6:
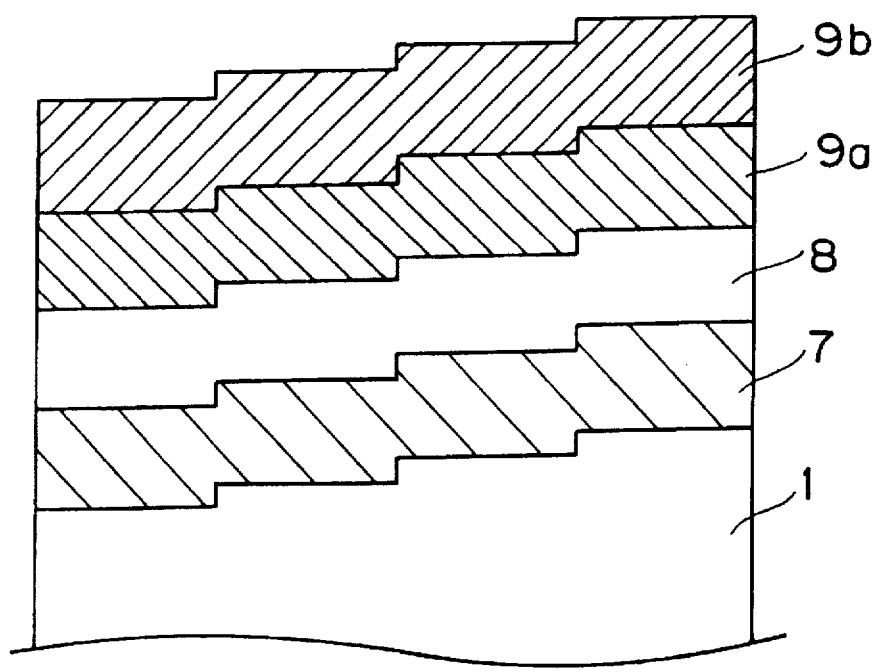
FIG. 6 is a typical sectional view showing a multilayer magnetic film according to still another Example of the first aspect of the present invention.

FIG. 6 shows still another Example prepared by forming still another type of multilayer magnetic film on a GaAs substrate 1 which was similar to those employed in the Examples shown in FIGS. 1 and 2. Co, Cu, NiFe and MnFe layers 7, 8, 9a and 9b having thicknesses of 40 Å, 40 Å, 60 Å and 80 Å respectively were successively formed on the GaAs substrate 1 by ion beam sputtering. In this Example, the Co layer 7 formed a first magnetic layer, while the NiFe and MnFe layers 9a and 9b formed a second magnetic layer. In such a multilayer magnetic film, the second magnetic layer formed by the NiFe and MnFe layers 9a and 9b differed in magnetization process from the Co layer 7 which was the first magnetic layer since the MnFe layer 9b was formed by an antiferromagnetic substance. Thus, the multilayer magnetic film was provided with a region having an anti-parallel magnetic moment due to magnetic field strength. Thus, this multilayer magnetic film also served as a spin valve type magnetic film. Also in this multilayer magnetic film, a high MR ratio was attained due to textures which were formed at the interfaces between the magnetic and non-magnetic layers.

While the Example shown in FIG. 6 was provided with a single unit consisting of the Co, Cu, NiFe and MnFe layers 7, 8, 9a and 9b, the present invention is also applicable to a structure which is formed by stacking a plurality of such units with each other.

Figure 7:
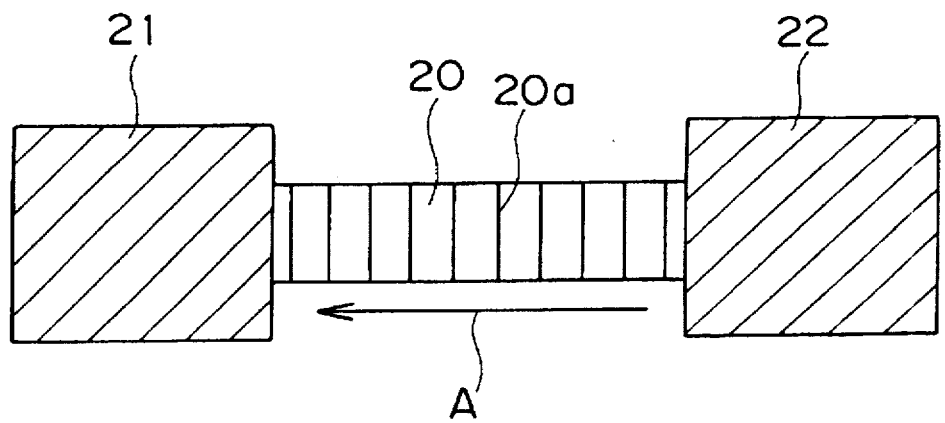
FIG. 7 is a plan view showing a magnetoresistive device according to an embodiment of the first aspect of the present invention.

FIG. 7 is a plan view showing a magnetoresistive device according to an embodiment of the present invention. Referring to FIG. 7, a multilayer magnetic film 20 is provided with a texture in the form of steps according to the present invention. Numeral 20a denotes step portions. Electrodes 21 and 22 are provided on both sides or ends of the magnetic film 20 in a direction A across the texture. Therefore, a measuring current flows in the direction A across the texture which is formed at the interface of the magnetic film 20. As can be seen in FIG. 7, the direction A in which the measuring current flows is substantially perpendicular to the longitudinal extension direction of each step portion 20a. According to this embodiment, the distance between the electrodes 21 and 22 is about 3 µm, and the width of the magnetic film 20 is in the range of 2 to 4 µm.

Figure 8:
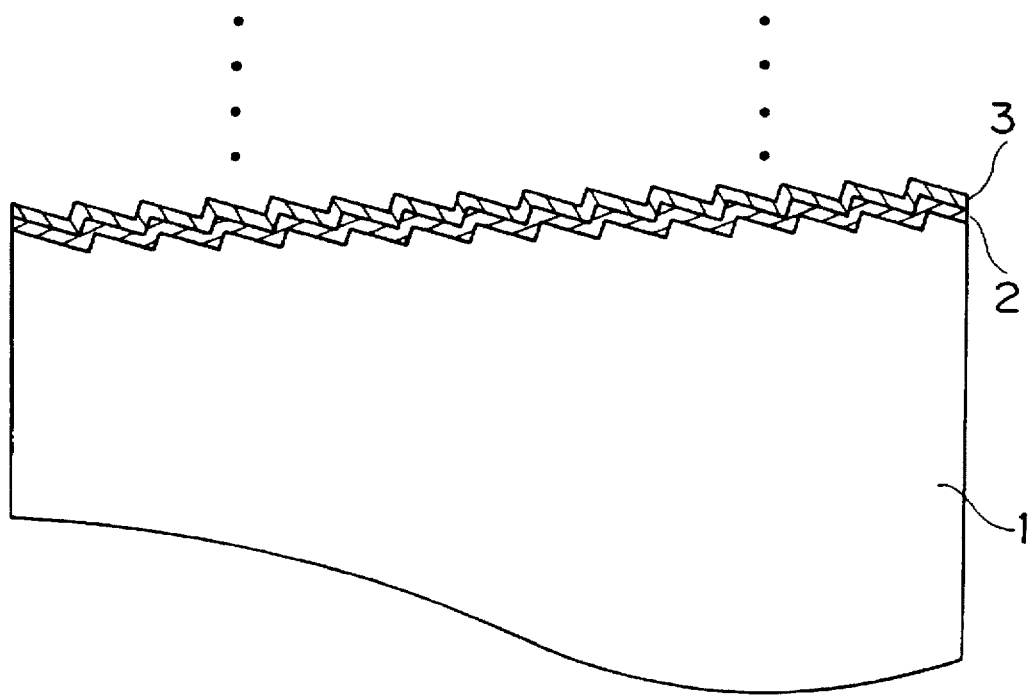
FIG. 8 is a sectional view typically showing a wider region of the Example shown in FIG. 1.

While each of FIGS. 1 to 3 and 6 illustrates the texture portion in an enlarged manner as if first and second ends of the substrate were different in height from each other, the texture was at an atomic level and hence the first and second ends of the substrate were not extremely different in height from each other. FIG. 8 is a sectional view typically showing the Example of FIG. 1. As shown in FIG. 8, the first and second ends of the substrate 1 were substantially flush or horizontally level with each other and a reference plane of the substrate 1 was substantially horizontal in practice.

An embodiment according to the second aspect of the present invention is now described.

Figure 9:
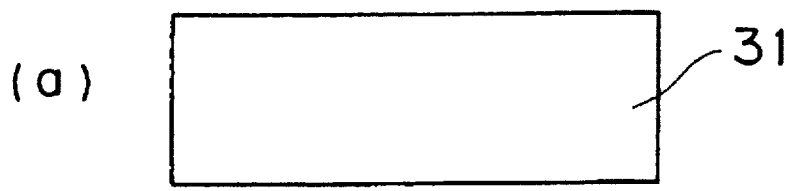
FIGS. 9(a) to 9(d) are typical sectional views showing steps of preparing a magnetoresistive device according to an embodiment of the second aspect of the present invention.
Figure 9:
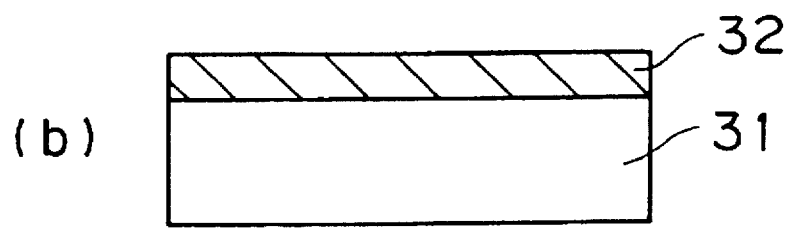
Figure 9:
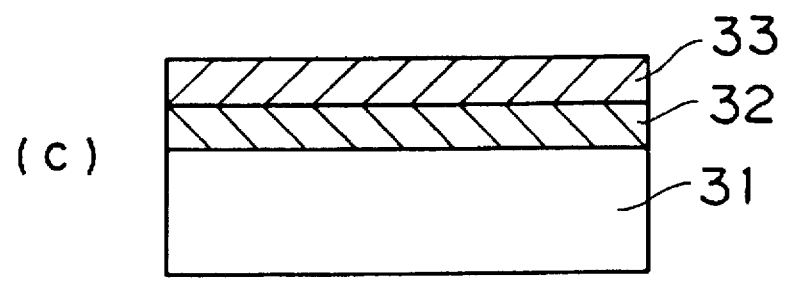
Figure 9:
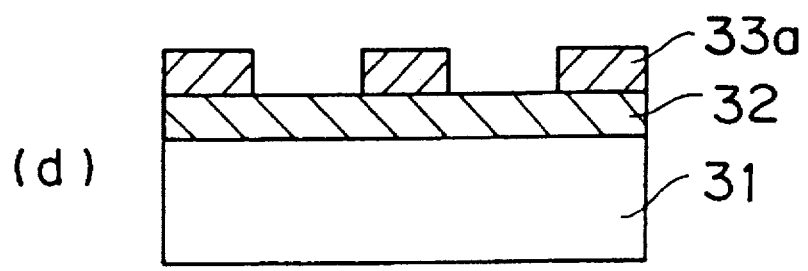
Figure 10:
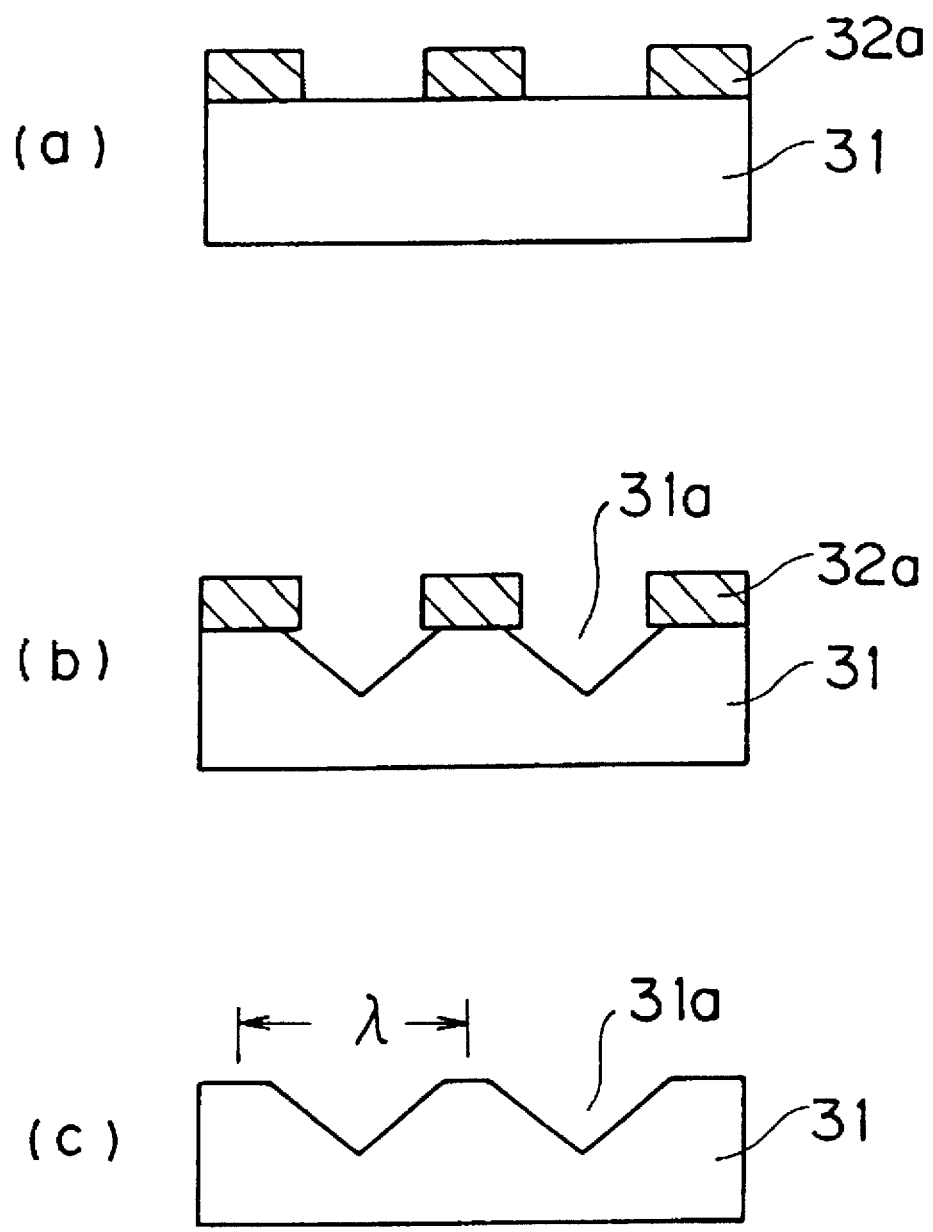
FIGS. 10(a) to 10(c) are typical sectional views showing steps of preparing the magnetoresistive device according to the embodiment of the second aspect of the present invention.

FIGS. 9(a) to 9(d) and 10(a) to 10(c) are respectively typical sectional views showing steps of preparing a magnetoresistive device of the embodiment according to the second aspect of the present invention. As shown in FIG. 9(a), a washed silicon substrate 31 is prepared. Then, a surface of the substrate 31 is thermally oxidized to form an oxide film 32 consisting of $SiO_2$ on the surface, as shown in FIG. 9(b).

Then, a resist film 33 is formed on the oxide film 32 by coating, as shown in FIG. 9(c). As shown in FIG. 9(d), the resist film 33 is exposed to an electron beam and patterned by development, to define resist films 33a. Then the oxide film 32 is etched and patterned with HF and acetone through the resist films 33a serving as masks.

FIG. 10(a) shows oxide films 32a defined after such patterning. Then, the surface of the substrate 31 is etched with a KOH solution through the oxide films 32a serving as mask layers, to form troughs or cavities 31a with angular ridges therebetween. Then, the oxide films 32a are removed by etching with HF, to form a texture on the substrate 31 through to the cavities 31a, as shown in FIG. 10(c). According to this embodiment, the substrate 31 is so arranged that its surface is formed by the (100) plane of the silicon substrate. Thus, the cavities 31a are so formed that inclined surfaces thereof are (111) planes.

Figure 11:
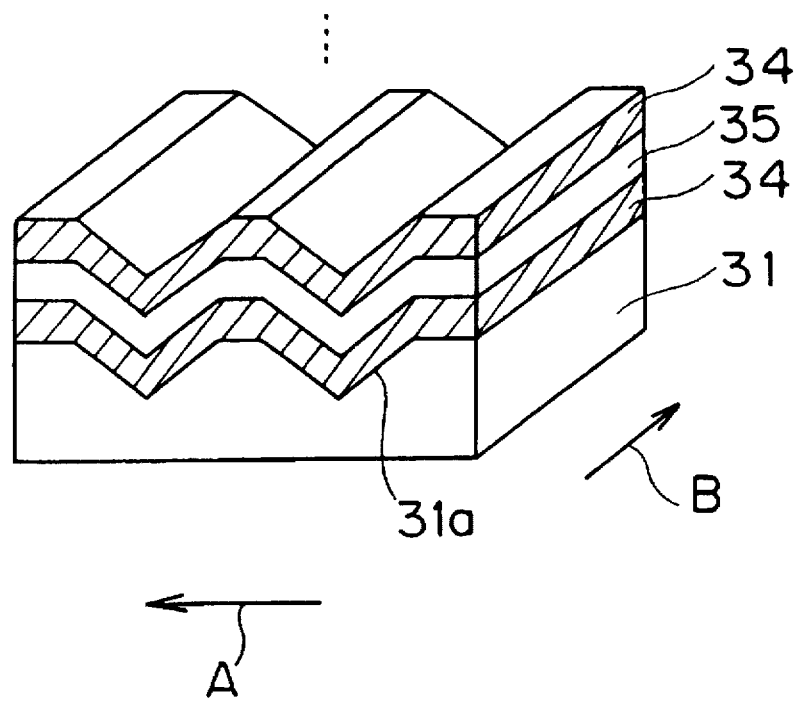
FIG. 11 is a perspective view showing a magnetoresistive device according to another embodiment of the second aspect of the present invention.

Then, Cu and Co layers 34 and 35 are alternately stacked on the substrate 31 having the texture on its surface, to form a magnetic film as shown in FIG. 11, for example. This magnetic film can be formed in a similar manner to that of Example shown in FIG. 1, for example.

According to the second aspect of the present invention, as hereinabove described, it is possible to form a texture which is larger than the atomic level texture according to the first aspect. According to the method of the present invention, further, the texture can be formed in an arbitrary plane shape and arbitrary dimensions by patterning the mask layers.

As to the texture on the substrate surface of the magnetoresistive device according to the second aspect of the present invention, the distance γ between centers of adjacent projections shown in FIG. 10(c) is preferably not more than 10 µm, more preferably not more than 2 µm, and further preferably not more than 1 µm. While a higher MR ratio may conceivably be attained as the distance γ is reduced in general, it is generally difficult to reduce the distance γ below 0.1 µm, in consideration of the technique such as photolithography. Therefore, the distance γ is preferably 0.1 to 10 µm, more preferably 0.1 to 2 µm, and further preferably 0.1 to 1 µm.

Also according to the second aspect of the present invention, the texture is formed at the interface between the magnetic and non-magnetic layers similarly to the first aspect, whereby a high MR ratio can be attained.

Figure 12:
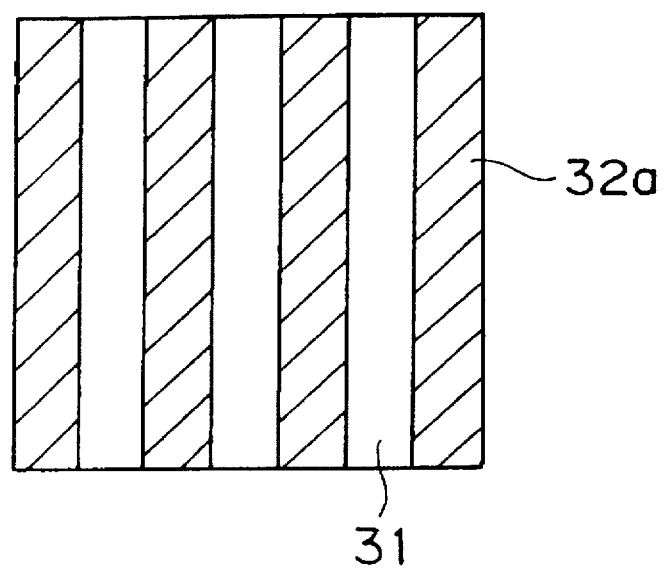
FIG. 12 is a plan view showing a pattern shape of mask layers according to the second aspect of the present invention.

FIG. 12 is a plan view showing the plane shape of the oxide films 32a, which are mask layers, shown in FIG. 10(a). As shown in FIG. 12, the oxide films 32a are provided as mask layers in the form of stripes. Thus, each texture is in the form of stripes, as shown in FIG. 11.

When each texture is formed only along arrow A and not along arrow B as shown in FIG. 11, in other words when the texture feature extends in the direction B, anisotropy is caused in MR properties. Namely, a high MR ratio cannot be attained when electrodes are arranged to feed a current along the direction of arrow B, although a high MR ratio is attained when the electrodes are arranged to feed the current along the direction of arrow A.

The texture according to the present invention is not restricted to the shape employed in the aforementioned embodiment, but may have a pyramidal or another shape.

FIGS. 13 to 16 are plan views showing plane shapes of patterns of mask layers according to other embodiments.

Figure 13:
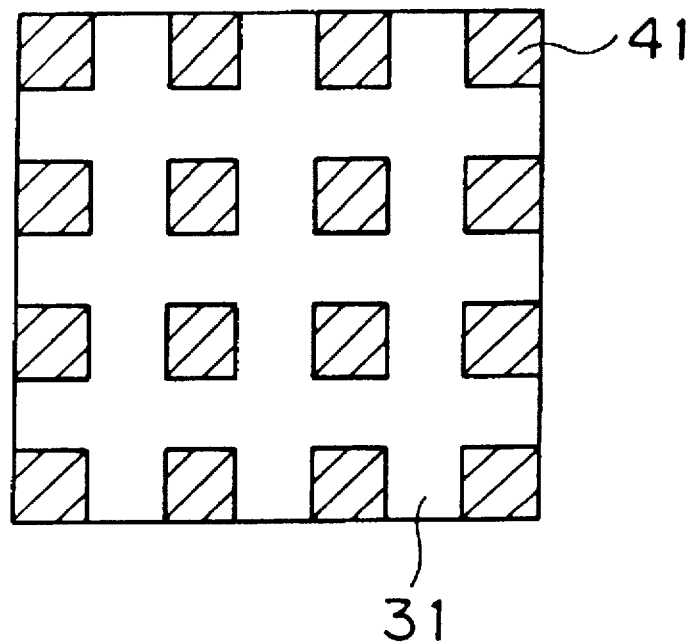
FIG. 13 is a plan view showing another pattern shape of mask layers according to the second aspect of the present invention.

When the pattern shape of mask layers 41 shown in FIG. 13 is employed, it is possible to form substantially identical projections along both the vertical and transverse directions in the view of FIG. 13. In this case, trapezoidal pyramidal projections having flat forward ends are arranged along the vertical and transverse directions.

Figure 14:
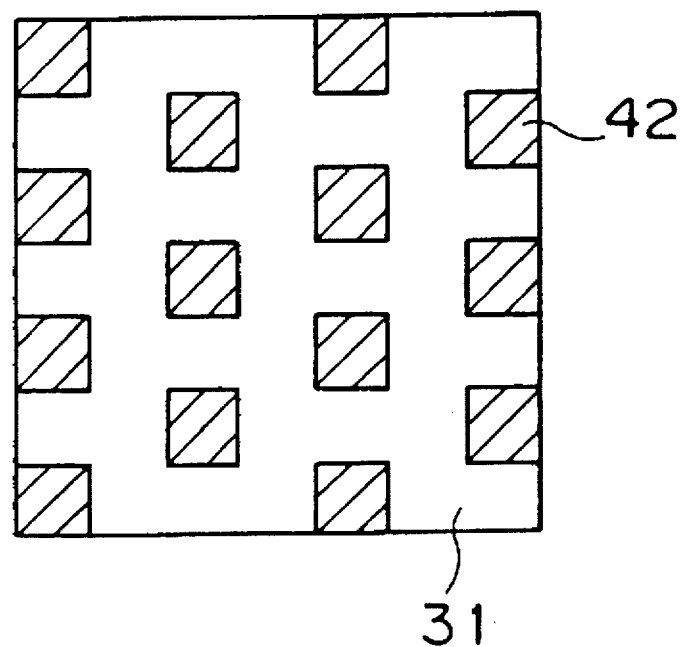
FIG. 14 is a plan view showing still another pattern shape of mask layers according to the second aspect of the present invention.

Also when mask layers 24 shown in FIG. 14 are employed, projections are similarly formed along the vertical and transverse directions.

When each texture is formed by either one of the patterns of the mask layers 41 and 42 shown in FIGS. 13 and 14, substantially identical projections are formed along the vertical and transverse directions, whereby excellent MR properties can be attained whether electrodes are arranged along the vertical or transverse direction.

Figure 15:
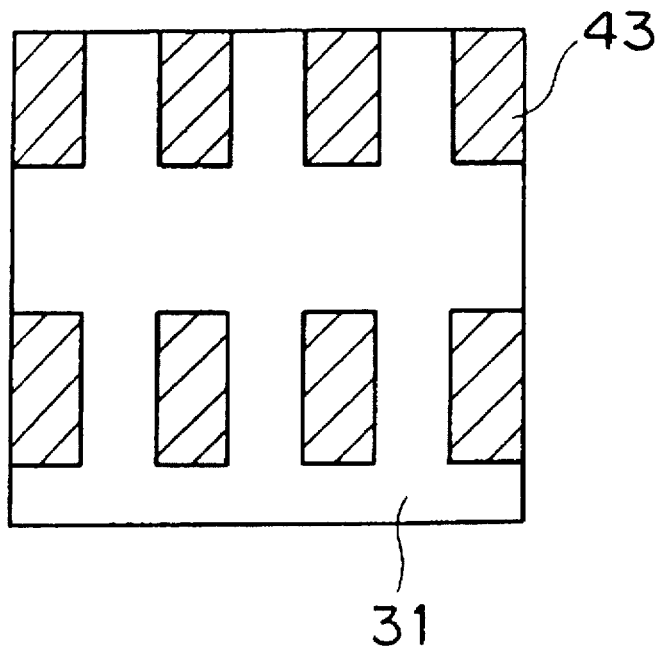
FIG. 15 is a plan view showing a further pattern shape of mask layers according to the second aspect of the present invention.

When mask layers 43 shown in FIG. 15 are employed, projections are formed in both of the vertical and transverse directions, while the respective extensions or dimensions of the projections along these directions are different from each other. Therefore, it is possible to obtain a magnetoresistive device whose MR properties are varied with the direction of arrangement of electrodes.

Figure 16:
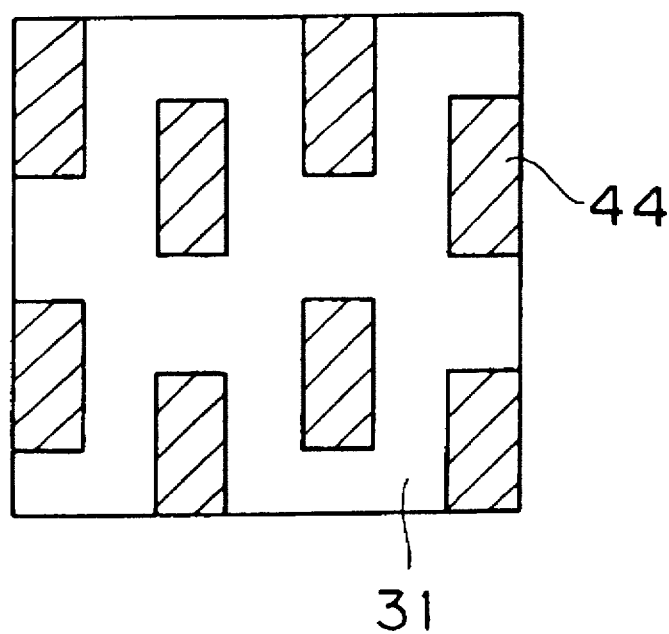
FIG. 16 is a plan view showing a further pattern shape of mask layers according to the second aspect of the present invention.

Also when mask layers 44 shown in FIG. 16 are employed, it is possible to obtain a magnetoresistive device whose MR properties are varied with the direction of arrangement of electrodes, similarly to the case of the mask layers 43 shown in FIG. 15.

While the bottoms of depressions defining the texture are formed as sharp portions where a plurality of inclined surfaces are butted against each other in the embodiment shown in FIGS. 9(a) to 11, the present invention is not restricted to such a shape, but the depressions may alternatively have substantially trapezoidal sections having flat portions on bottom parts thereof, for example.

While the magnetic film called an artificial lattice type film is formed on the substrate 31 in the embodiment shown in FIG. 11 similarly to Example shown in FIG. 1, the present invention is not restricted to this but a spin valve type magnetic film shown in FIG. 2 or 6 may alternatively be formed on the substrate 31. Further, still another type of magnetic film may be formed on the substrate 31.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A magnetoresistive device comprising:
   a substrate comprising a single-crystalline off substrate, having a substrate surface that is cut with a major extension thereof along a plane that is inclined relative to a low index lattice plane of a single crystal of said single crystalline off substrate, and having on said substrate surface a substantially regular atomic level substrate texture comprising a first plurality of repetitive angular ridges distributed over said substrate surface in at least one direction;
   a magnetic film arranged on said substrate surface as a continuous layer extending across said substrate surface, and comprising magnetic and non-magnetic layers stacked one on another with an interface therebetween, and having on said interface a substantially regular atomic level interface texture comprising a second plurality of repetitive angular ridges distributed over said interface in said at least one direction; and
   a pair of electrodes arranged spaced apart from one another on said magnetic film such that a current flowing through said magnetic film between said electrodes would flow substantially in said one direction and across said second plurality of repetitive angular ridges of said interface texture.

2. The magnetoresistive device of claim 1, wherein said substrate is a GaAs substrate.

3. The magnetoresistive device of claim 2, wherein said low index lattice plane is a (100) plane, and said plane of said substrate surface is inclined by 2° from said (100) plane.

4. The magnetoresistive device of claim 1, comprising first and second ones of said magnetic layer, and wherein said non-magnetic layer is arranged between said first and second magnetic layers.

5. The magnetoresistive device of claim 4, wherein said first magnetic layer comprises a first magnetic material and said second magnetic layer comprises a second magnetic material, wherein said first and second magnetic materials both have at least substantially the same composition and at least substantially the same coercive force.

6. The magnetoresistive device of claim 4, wherein said first magnetic layer comprises a first magnetic material and said second magnetic layer comprises a second magnetic material, wherein said first and second magnetic materials respectively have different coercivities.

7. The magnetoresistive device of claim 4, wherein said first and second magnetic layers are respective Co layers, and said non-magnetic layer is a Cu layer.

8. The magnetoresistive device of claim 4, wherein said first magnetic layer is a Co layer, said second magnetic layer is an Fe layer, and said non-magnetic layer is a Cu layer.

9. The magnetoresistive device of claim 4, wherein said first magnetic layer is a Co layer, said second magnetic layer comprises an NiFe layer and an MnFe layer, and said non-magnetic layer is a Cu layer.

10. The magnetoresistive device of claim 1, wherein each of said magnetic and non-magnetic layers of said magnetic film is respectively a continuous layer uninterrupted by said substrate texture and by said interface texture.

11. The magnetoresistive device of claim 10, wherein each of said angular ridges of said substrate texture has a respective triangular cross-sectional ridge shape including a first ridge face and a second ridge face, and wherein said magnetic film is formed on and covers said first and second ridge faces of said angular ridges with said magnetic and non-magnetic layers arranged continuously along and over said first and second ridge faces of said angular ridges.

12. The magnetoresistive device of claim 10, wherein a second texture pattern of said interface texture corresponds to and aligns with a first texture pattern of said substrate texture.

13. The magnetoresistive device of claim 1, wherein said major extension plane of said substrate surface is inclined relative to said low index lattice plane at an angle in a range from about 2° to about 15°.

14. The magnetoresistive device of claim 1, wherein said electrodes and said magnetic film are arranged such that said current flowing through said magnetic film flows substantially along and parallel to said interfaces of said magnetic film.

15. The magnetoresistive device of claim 1 wherein said second plurality of repetitive angular ridges are substantially regularly spaced from 3 to 30 angstroms apart.

* * * * *

UNITED STATES PATENT AND TRADEMARK OFFICE
CERTIFICATE OF CORRECTION

PATENT NO. : 5,680,091
DATED : Oct. 21, 1997
INVENTOR(S) : Maeda et al.

It is certified that error appears in the above-identified patent and that said Letters Patent is hereby corrected as shown below:

Col. 8, line 17, (actual line count), replace "$\gamma$" by --$\lambda$--.
line 21, (actual line count), replace "$\gamma$" by --$\lambda$--.
line 22, (actual line count), replace "$\gamma$" by --$\lambda$--.
line 24, (actual line count), replace "$\gamma$" by --$\lambda$--.

Signed and Sealed this

Sixth Day of January, 1998

Attest:

BRUCE LEHMAN

*Attesting Officer*          *Commissioner of Patents and Trademarks*